US010734475B2

(12) United States Patent
Ando et al.

(10) Patent No.: US 10,734,475 B2
(45) Date of Patent: Aug. 4, 2020

(54) STACKED MIM CAPACITORS WITH SELF-ALIGNED CONTACT TO REDUCE VIA ENCLOSURE

(71) Applicant: INTERNATIONAL BUSINESS MACHINES CORPORATION, Armonk, NY (US)

(72) Inventors: Takashi Ando, Tuckahoe, NY (US); Robert Allen Groves, Highland, NY (US); Hemanth Jagannathan, Niskayuna, NY (US); Lawrence A. Clevenger, Saratoga Springs, NY (US); Griselda Bonilla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 107 days.

(21) Appl. No.: 15/944,053

(22) Filed: Apr. 3, 2018

(65) Prior Publication Data
US 2019/0305076 A1    Oct. 3, 2019

(51) Int. Cl.
*H01L 27/08* (2006.01)
*H01L 49/02* (2006.01)
(Continued)

(52) U.S. Cl.
CPC ........ *H01L 28/75* (2013.01); *H01L 21/76804* (2013.01); *H01L 21/76831* (2013.01);
(Continued)

(58) Field of Classification Search
CPC ................................ H01L 28/75; H01L 28/87
See application file for complete search history.

(56) References Cited

U.S. PATENT DOCUMENTS 6,166,423 A    12/2000 Gambino et al.
6,426,250 B1    7/2002 Lee et al.
(Continued)

OTHER PUBLICATIONS

Ando et al., "CMOS Compatible MIM Decoupling Capacitor with Reliable Sub-nm EOT High-k Stacks for the 7 nm Node and Beyond," 2016 IEEE International Electron Devices Meeting. Dec. 3-7, 2016. pp. 1-4.
(Continued)

*Primary Examiner* — Daniel Whalen
(74) *Attorney, Agent, or Firm* — Tutunjian & Bitetto, P.C.; Vazken Alexanian

(57) ABSTRACT

A method is presented for forming a stacked metal-insular-metal (MIM) capacitor with self-aligned contact. The method includes forming a first electrode plate over a first interlayer dielectric (ILD), forming a first spacer adjacent the first electrode plate, forming a first insulating layer over the first electrode plate, forming a second electrode plate over the first insulating layer, and forming a second spacer adjacent the second electrode plate and the first insulating layer. The method further includes forming a second insulating layer over the second electrode plate, forming a third electrode plate over the second insulating layer, forming a third spacer adjacent the third electrode plate and the second insulating layer, and forming a second ILD over the third electrode plate. The method also includes forming a first via through the second ILD and directly contacting the second spacer such to prevent the first via from contacting the second electrode plate.

18 Claims, 7 Drawing Sheets

(51) Int. Cl.
*H01L 21/768* (2006.01)
*H01L 23/522* (2006.01)

(52) U.S. Cl.
CPC .... *H01L 21/76879* (2013.01); *H01L 23/5223* (2013.01); *H01L 27/0805* (2013.01)

(56) References Cited

U.S. PATENT DOCUMENTS

| | | |
|---|---|---|
| 7,329,955 B2 | 2/2008 | Tsau |
| 7,338,879 B2 | 3/2008 | Won |
| 8,609,530 B2 | 12/2013 | Jeannot et al. |
| 9,425,192 B2 | 8/2016 | Rahim et al. |
| 9,761,655 B1 * | 9/2017 | Ando ............... H01L 28/75 |
| 2018/0025974 A1 | 1/2018 | Basker et al. |
| 2019/0131385 A1 * | 5/2019 | Huang ............... H01L 28/60 |

OTHER PUBLICATIONS

Fischer et al., "Low-K Interconnect Stack with Multi-layer Air Gap and Tri-Metal-Insulator-Metal Capacitors for 14nm High Volume Manufacturing," 2015 IEEE International Interconnect Technology Conference/2015 IEEE Materials for Advance Metallization Conference. May 18-21, 2015. pp. 1-4.

* cited by examiner

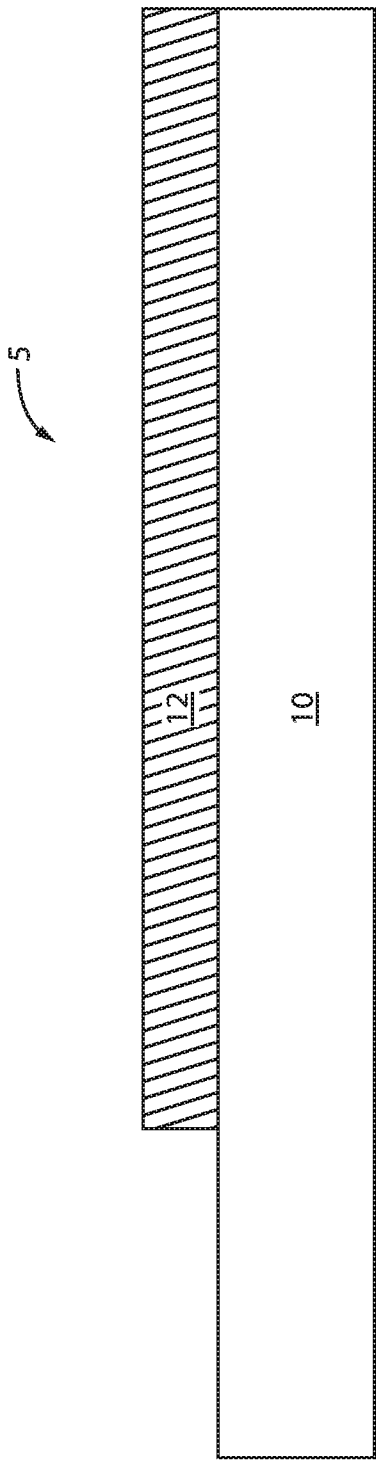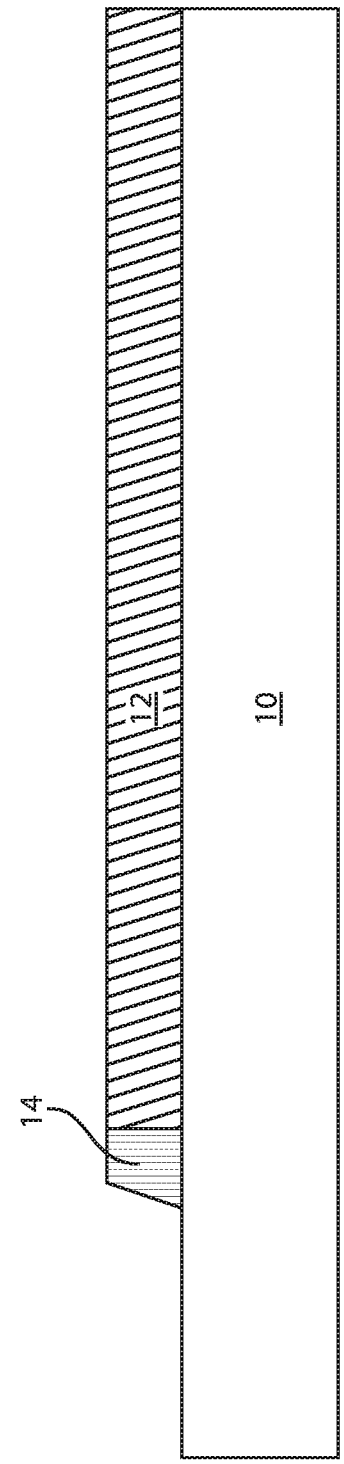

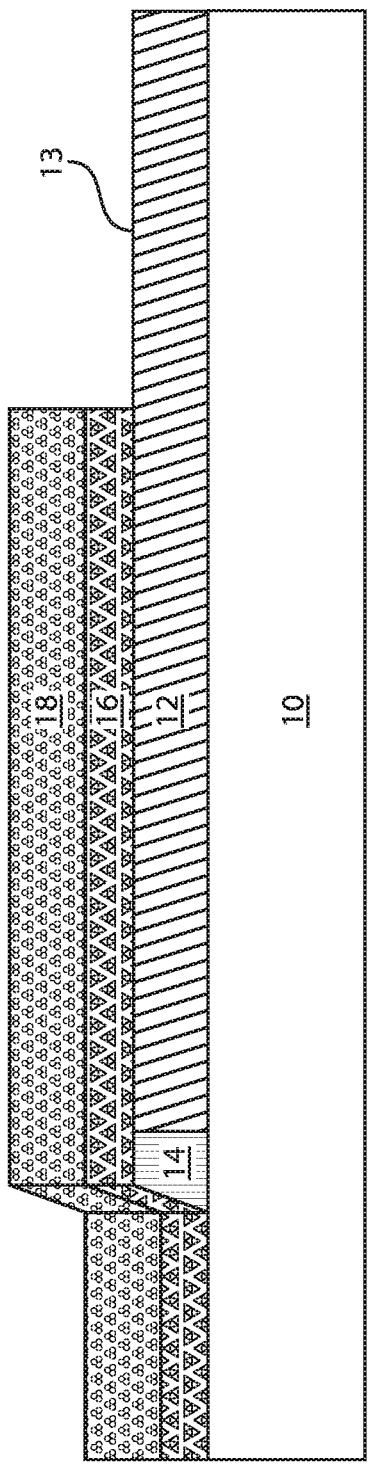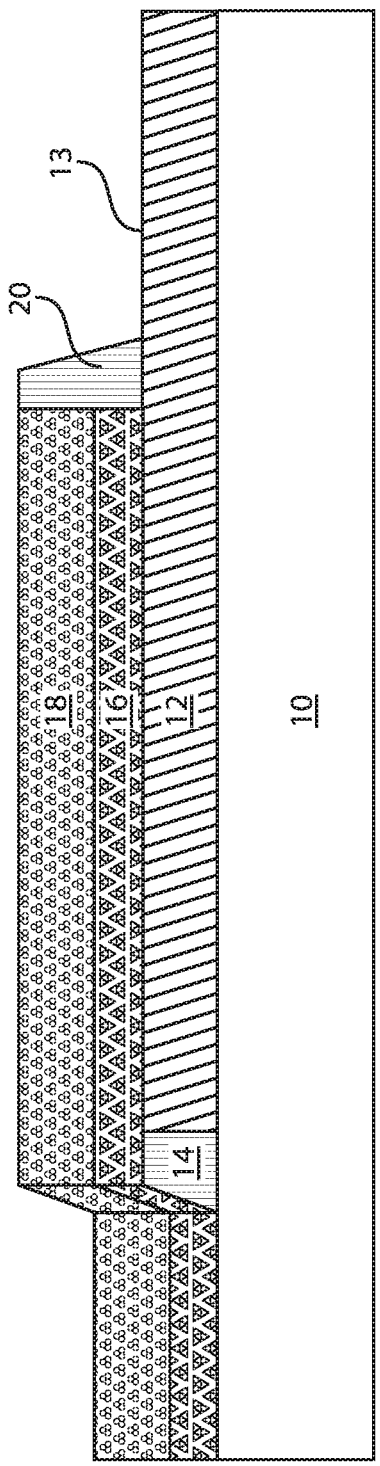

US 10,734,475 B2

STACKED MIM CAPACITORS WITH SELF-ALIGNED CONTACT TO REDUCE VIA ENCLOSURE

BACKGROUND

Technical Field

The present invention relates generally to semiconductor devices, and more specifically, to forming stacked metal-insulator-metal (MIM) capacitors with self-aligned contact to reduce via enclosure.

Description of the Related Art

In fabricating electrical connections to semiconductor devices, capacitors are often included in the metallization structure, for example, metal-insulator-metal (MIM) capacitors. Compared to polysilicon capacitors, MIM capacitors have higher operating frequencies, lower substrate parasitic capacitance and resistance, and potentially lower leakage current. Currently, however, fabricating MIM capacitors in the metallization structure is more complex than necessary.

SUMMARY

In accordance with an embodiment, a method is provided for forming a stacked metal-insular-metal (MIM) capacitor with self-aligned contact. The method includes forming a first electrode plate over a first interlayer dielectric (ILD), forming a first spacer adjacent the first electrode plate, forming a first insulating layer over the first electrode plate, forming a second electrode plate over the first insulating layer, and forming a second spacer adjacent the second electrode plate and the first insulating layer. The method further includes forming a second insulating layer over the second electrode plate, forming a third electrode plate over the second insulating layer, forming a third spacer adjacent the third electrode plate and the second insulating layer, forming a second ILD over the third electrode plate, and forming a first via through the second ILD and directly contacting the second spacer such that the second spacer prevents the first via from contacting the second electrode plate.

In accordance with another embodiment, a method is provided for forming a stacked metal-insular-metal (MIM) capacitor with self-aligned contact. The method includes forming a plurality of electrode plates separated from each other by dielectric layers and forming at least one spacer adjacent at least one electrode plate of the plurality of electrode plates to electrically separate the at least one electrode plate from a via.

In accordance with yet another embodiment, a semiconductor structure is provided for constructing a stacked metal-insulator-metal (MIM) capacitor with self-aligned contact. The semiconductor structure includes a first electrode plate disposed over a first interlayer dielectric (ILD), a first spacer disposed adjacent the first electrode plate, a first insulating layer disposed over the first electrode plate, a second electrode plate disposed over the first insulating layer, and a second spacer disposed adjacent the second electrode plate and the first insulating layer. The semiconductor structure further includes a second insulating layer disposed over the second electrode plate, a third electrode plate disposed over the second insulating layer, a third spacer disposed adjacent the third electrode plate and the second insulating layer, a second ILD disposed over the third electrode plate, and a first via disposed through the second ILD to directly contact the second spacer such that the second spacer prevents the first via from contacting the second electrode plate.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein:

FIG. 1 is a cross-sectional view of a semiconductor structure including a bottom electrode plate formed over an interlayer dielectric, in accordance with an embodiment of the present invention;

FIG. 2 is a cross-sectional view of the semiconductor structure of FIG. 1 where a first spacer is formed adjacent the bottom electrode plate, in accordance with an embodiment of the present invention;

FIG. 3 is a cross-sectional view of the semiconductor structure of FIG. 2 where a first high-k dielectric material and a middle electrode plate are formed over the bottom electrode plate and the first spacer, in accordance with an embodiment of the present invention;

FIG. 4 is a cross-sectional view of the semiconductor structure of FIG. 3 where a second spacer is formed adjacent the middle electrode plate and the first high-k dielectric material, in accordance with an embodiment of the present invention;

Throughout the drawings, same or similar reference numerals represent the same or similar elements.

DETAILED DESCRIPTION

Figure 5:
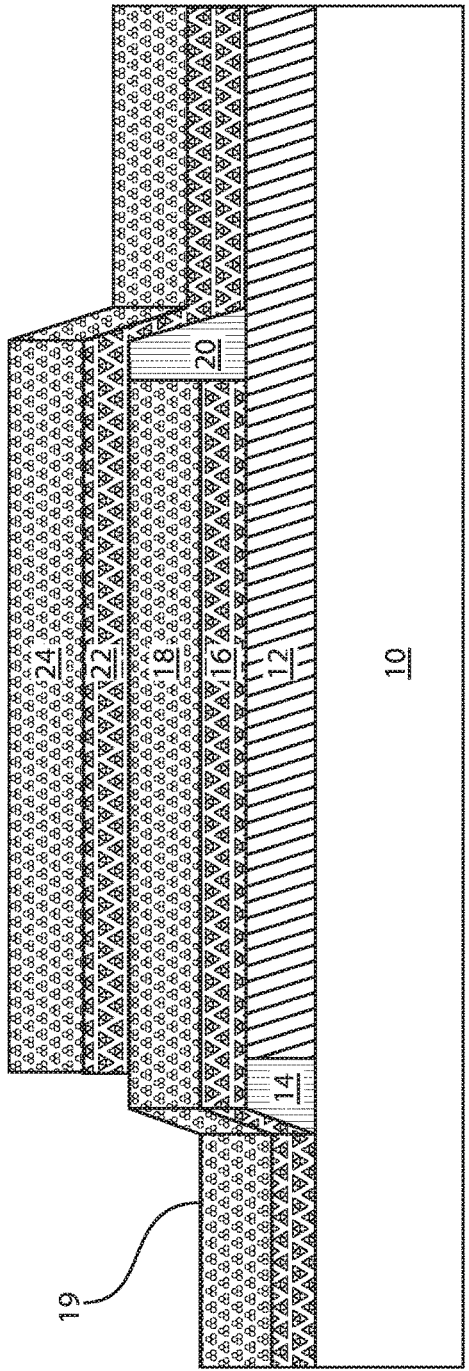
FIG. 5 is a cross-sectional view of the semiconductor structure of FIG. 4 where a second high-k dielectric material and a top electrode plate are formed over the middle electrode plate, in accordance with an embodiment of the present invention.

Embodiments in accordance with the present invention provide methods and devices for designing an electronic circuit with redefined design rules. The redefined design rules pertain to vias formed within a semiconductor structure. Design of an electronic circuit, for example, an integrated circuit (IC), is a complicated and time consuming process. Generally, a design flow commences with defining the design specifications or requirements. The requirements of the design are implemented, for example, as a netlist or electronic circuit description. The implementation can be performed by, for example, schematic capture (drawing the design with a computer aided design tool). The implemented design is simulated to verify design accuracy. Design implementation and simulation are iterative processes. For example, errors found by simulation are corrected by design implementation and re-simulated.

Once the design is verified for accuracy with simulation, a design layout of the design is created. The design layout describes the detailed design geometries and the relative positioning of each design layer to be used in actual fabrication. The design layout is very tightly linked to overall circuit performance (area, speed and power dissipation) because the physical structure defined by the design layout determines, for example, the parasitic capacitances and resistances, and the silicon area which is employed to realize a certain function. The detailed design layout can be a very intensive and time-consuming design effort and is usually performed utilizing specialized computer aided design (CAD) or Electronic Design Automation (EDA) tools.

The design layout is checked against a set of design rules in a design rule check (DRC). The created design layout must conform to a complex set of design rules in order, for example, to ensure a lower probability of fabrication defects. The design rules specify, for example, how far apart the geometries on various layers must be, or how large or small various aspects of the layout must be for successful fabrication, given the tolerances and other limitations of the fabrication process. A design rule can be, for example, determining via enclosure rules. DRC is a time-consuming iterative process that needs manual manipulation and interaction by the designer. The designer performs design layout and DRC iteratively, reshaping and moving design geometries to correct all layout errors and achieve a DRC clean (violation free) design.

In semiconductor design technology, many metal layers are employed to implement interconnections throughout an integrated circuit. For some integrated circuits, one or more polysilicon (poly) layers, or even active areas, are also used to implement interconnections. Vias are employed to connect from one such metal or polysilicon layer to another metal or polysilicon layer. For example, a via can be used to connect a feature (i.e., a design geometry) on each of two metal layers. The lower one of the two layers is referred to as the landing metal layer and the upper one of the two layers is referred to as the covering layer. A via between a landing metal layer $mt_x$ and the covering metal layer $mt_{x+1}$ is usually referred to as a $v_x$ via (i.e., using the same subscript designation as the landing metal layer).

Most design technologies include via enclosure rules to ensure that both the landing metal and the covering metal enclose the via by a certain amount. In other words, such an enclosure rule ensures that each metal layer overlaps a via with a certain amount of extra metal, to ensure that the via provides a good connection between the two metal layers once fabricated. The design rule specifying the extra amount of metal around each via can be referred to as a metal enclosure of a via design rule, and at times simply as a via enclosure design rule.

Embodiments in accordance with the present invention provide methods and devices for eliminating or significantly reducing the via enclosure rules to boost total capacitance in a given footprint area. This can be accomplished by employing a planar metal-insulator-metal (MIM) capacitor with multiple electrode plates or metallization layers having spacers at the edges for self-aligned contact. All the electrode plates have spacers for self-aligned contact. Thus, the edges of all electrode plates are protected by spacers for self-aligned contact. As a result, the largest possible capacitance can be maintained within a given area by employing spacers at edges of electrode plates.

Examples of semiconductor materials that can be employed in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

FIG. 1 is a cross-sectional view of a semiconductor structure including a bottom electrode plate formed over an interlayer dielectric, in accordance with an embodiment of the present invention.

The semiconductor structure 5 includes an interlayer dielectric (ILD) 10 and a first electrode plate 12 formed thereon. The first electrode plate 12 can be referred to as a bottom electrode plate 12 or a metallization layer.

In one or more embodiments, ILD 10 can have a thickness in the range of about 10 nm to about 400 nm, or in the range of about 10 nm to about 100 nm. ILD 10 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC, also known as amorphous hydrogenated carbon, α-C:H). Additional choices for ILD 10 include any of the aforementioned materials in porous form, or in a form that changes during processing to or from being porous and/or permeable to being non-porous and/or non-permeable.

The bottom electrode plate 12 can be formed from, e.g., titanium nitride (TiN). The TiN bottom plate 12 can be deposited by using, for example, physical vapor deposition (PVD). In other example embodiments, the bottom electrode plate 12 can include, but is not limited to tantalum nitride (TaN).

The material of the bottom electrode plate 12 can be referred to as a "metallic compound" which can be a conductive transition metal nitride and/or a conductive transition metal carbide. The metallic compound is a compound of a first metallic element selected from transition metals and a non-metallic element. If the non-metallic element is nitrogen, the metallic compound is a transition metal nitride. If the non-metallic element is carbon, the metallic compound is a transition metal carbide. For example, the metallic compound can be selected from TiN, TiC, TaN, TaC, and a combination thereof. As used herein, transition metals include elements from Group 3B, 4B, 5B, 6B, 7B, 8B, 1B, and 2B and Lanthanides and Actinides in the Periodic Table of the Elements. The thickness of the bottom electrode plate 12 can be from about 1 nm to about 100 nm, and particularly from about 10 nm to about 50 nm, although lesser and greater thicknesses are also contemplated herein.

FIG. 2 is a cross-sectional view of the semiconductor structure of FIG. 1 where a first spacer is formed adjacent the bottom electrode plate, in accordance with an embodiment of the present invention.

In various exemplary embodiments, a first spacer 14 is shown formed adjacent the bottom electrode plate 12. The first spacer 14 can be formed by first providing a spacer material and then etching the spacer material. The spacer material can include any dielectric spacer material including, for example, a dielectric oxide, dielectric nitride, and/or dielectric oxynitride. In one example, the spacer material can include silicon oxide or silicon nitride. The spacer material can be provided by a deposition process including, for example, chemical vapor deposition (CVD), plasma enhanced chemical vapor deposition (PECVD), or atomic layer deposition (ALD). The etching of the spacer material can include a dry etch process such as, for example, a reactive ion etch (RIE).

The first spacer 14 can be constructed in different shapes. For example, the first spacer 14 can be constructed as a substantially triangular shape or a substantially trapezoidal shape. The first spacer 14 can have at least one tapered or slanted or inclined or oblique surface.

FIG. 3 is a cross-sectional view of the semiconductor structure of FIG. 2 where a first high-k dielectric material and a middle electrode plate are formed over the bottom electrode plate and the first spacer, in accordance with an embodiment of the present invention.

In various exemplary embodiments, a first high-k dielectric material 16 is formed over a portion of the bottom electrode 12 and the ILD 10. A top surface 13 of a portion of the bottom electrode 12 remains exposed. Additionally, a second electrode plate 18 is formed over the first high-k dielectric material 16. The second electrode plate 18 can be referred to as a middle electrode plate or middle metallization layer.

The first high-k dielectric layer 16 includes a high dielectric constant (high-k) material having a dielectric metal oxide and having a dielectric constant that is greater than the dielectric constant of silicon nitride of 7.5. The first high-k dielectric layer 16 can be formed by methods well known in the art including, for example, chemical vapor deposition (CVD), atomic layer deposition (ALD), molecular beam deposition (MBD), pulsed laser deposition (PLD), liquid source misted chemical deposition (LSMCD), etc.

The dielectric metal oxide (of first high-k dielectric layer 16) includes a metal and oxygen, and optionally nitrogen and/or silicon. Exemplary high-k dielectric materials include but are not limited to metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaI_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$), and combinations thereof.

Each value of x is independently from 0.5 to 3 and each value of y is independently from 0 to 2. The thickness of the first high-k dielectric layer 16 can be from about 1 nanometer (nm) to about 10 nm, and particularly from about 3 nm to about 8 nm. The first high-k dielectric layer 16 can have an effective oxide thickness (EOT) on the order of, or less than, about 1 nm.

The middle electrode plate 18 can be formed from the same material as the bottom electrode plate 12. In an alternative embodiment, the middle electrode plate 18 can be formed from a different material than the bottom electrode plate 12. The thickness of the bottom and middle electrode plates 12, 18 can be approximately equal.

FIG. 4 is a cross-sectional view of the semiconductor structure of FIG. 3 where a second spacer is formed adjacent the middle electrode plate and the first high-k dielectric material, in accordance with an embodiment of the present invention.

In various exemplary embodiments, a second spacer 20 is formed adjacent the first high-k dielectric material 16 and the middle electrode plate 18. The second spacer 20 directly contacts the bottom electrode plate 12 and the middle electrode plate 18.

The second spacer 20 can be constructed in different shapes. For example, the second spacer 20 can be constructed as a substantially triangular shape or a substantially trapezoidal shape. The second spacer 20 can have at least one tapered or slanted or inclined or oblique surface.

FIG. 5 is a cross-sectional view of the semiconductor structure of FIG. 4 where a second high-k dielectric material and a top electrode plate are formed over the middle electrode plate, in accordance with an embodiment of the present invention.

In various exemplary embodiments, a second high-k dielectric material 22 and a top electrode plate 24 are formed over the middle electrode plate 18. The second high-k dielectric material 22 directly contacts the second spacer 20 and further directly contacts a top surface 13 of the bottom electrode plate 12.

The top electrode plate 24 can be formed from the same material as the bottom and middle electrode plates 12, 18. In an alternative embodiment, the top electrode plate 24 can be formed from a different material than the bottom and middle electrode plates 12, 18. The thickness of the bottom, middle, and top electrode plates 12, 18, 24 can be approximately equal.

Figure 6:
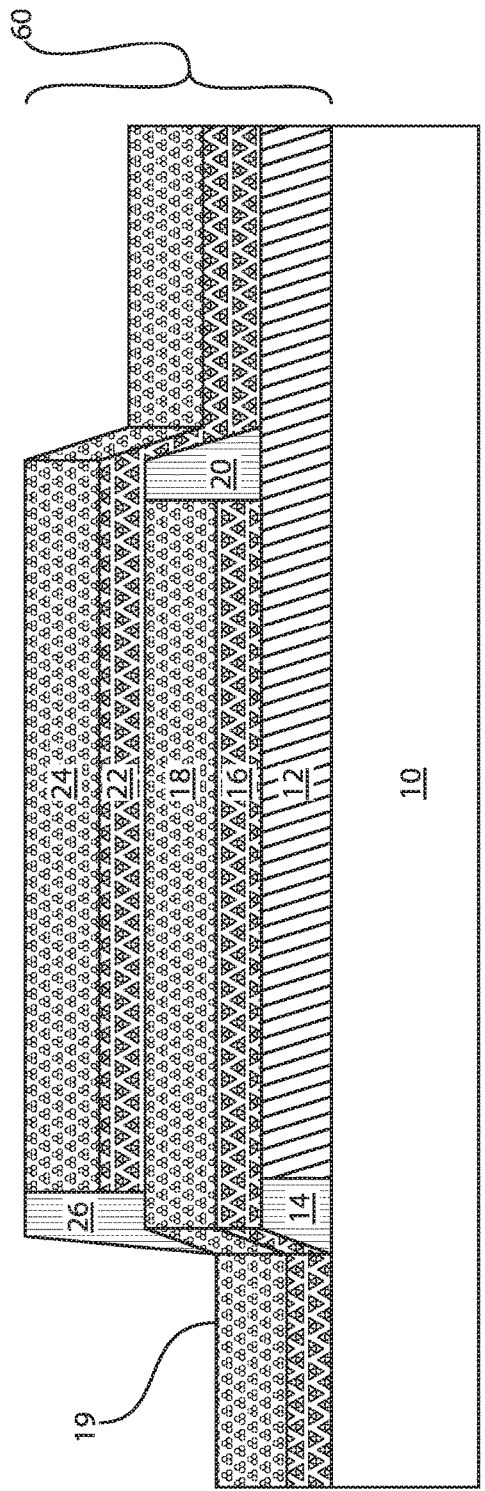
FIG. 6 is a cross-sectional view of the semiconductor structure of FIG. 5 where a third spacer is formed adjacent the top electrode plate and the second high-k dielectric material, in accordance with an embodiment of the present invention.

FIG. 6 is a cross-sectional view of the semiconductor structure of FIG. 5 where a third spacer is formed adjacent the top electrode plate and the second high-k dielectric material, in accordance with an embodiment of the present invention.

In various exemplary embodiments, a third spacer 26 is formed adjacent the top electrode plate 24 and the second high-k dielectric material 22. The third spacer 26 can be substantially aligned with the first spacer 14. The third spacer 26 directly contacts the middle electrode plate 18 and the top electrode plate 24. A top surface 19 of the middle electrode plate 18 remains exposed after formation of the third spacer 26. Thus, a metal-insulator-metal (MIM) capacitor 60 can be formed. The MIM capacitor structure 60 can include 3 metallization layers 12, 18, 24 and 2 insulator layers 16, 22. Of course, one skilled in the art can contemplate employing a different number of alternating metallization and insulating layers to form MIM structures.

The third spacer 26 can be constructed in different shapes. For example, the third spacer 26 can be constructed as a substantially triangular shape or a substantially trapezoidal shape. The third spacer 26 can have at least one tapered or slanted or inclined or oblique surface.

Figure 7:
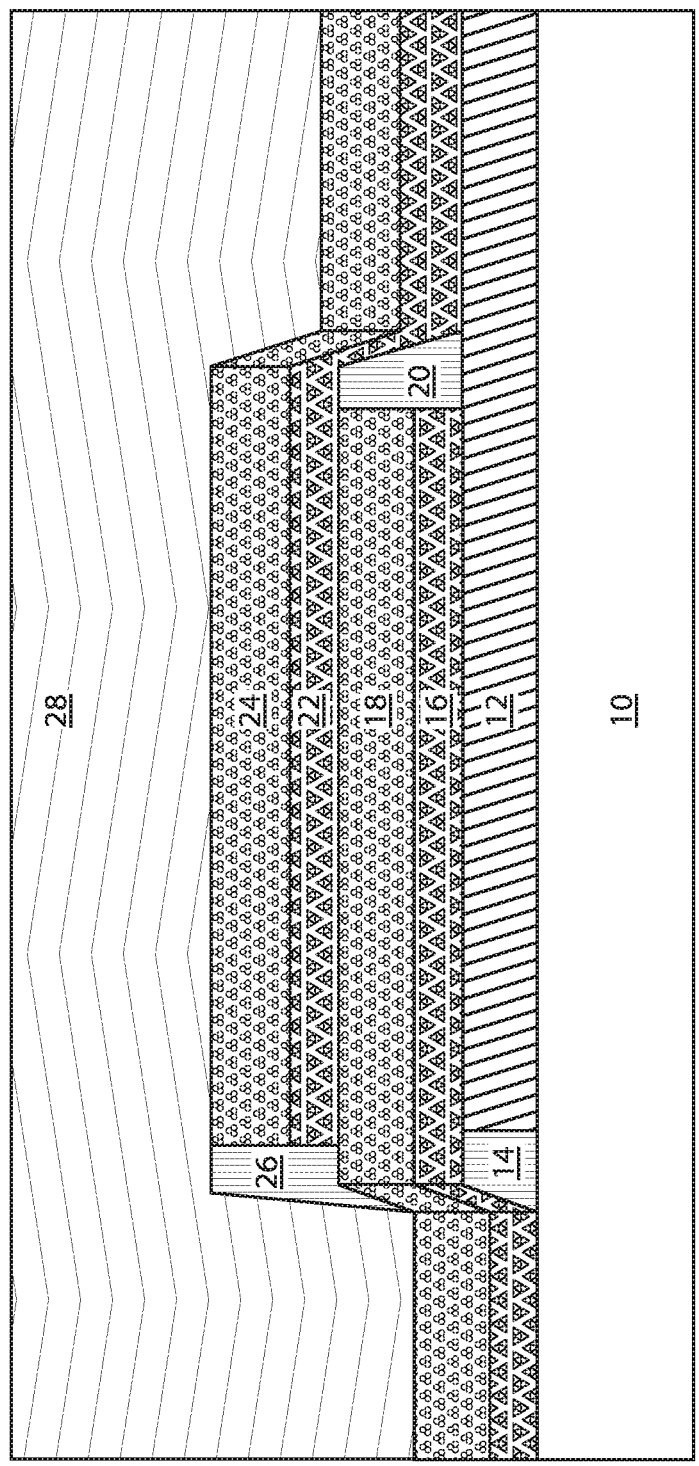
FIG. 7 is a cross-sectional view of the semiconductor structure of FIG. 6 where an interlayer dielectric (ILD) layer is formed over the top electrode plate, in accordance with an embodiment of the present invention.

FIG. 7 is a cross-sectional view of the semiconductor structure of FIG. 6 where an interlayer dielectric (ILD) layer is formed over the top electrode plate, in accordance with an embodiment of the present invention.

In various exemplary embodiments, an ILD layer 28 is formed over the top electrode plate 24, over the third electrode 26, and over an exposed portion 19 of the middle electrode plate 18.

In various exemplary embodiments, a height of the ILD 28 can be reduced by chemical-mechanical polishing (CMP) and/or etching. Therefore, the planarization process can be provided by CMP. Other planarization processes can include grinding and polishing.

Figure 8:
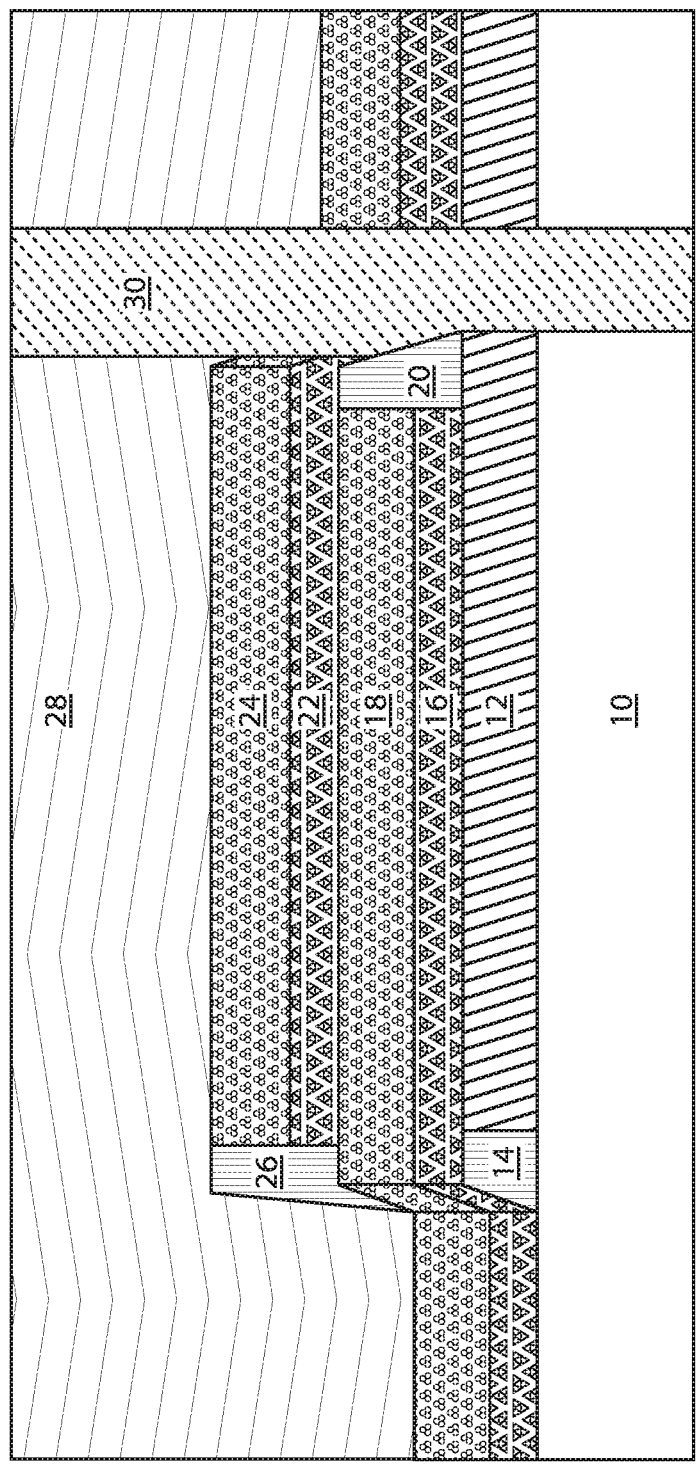
FIG. 8 is a cross-sectional view of the semiconductor structure of FIG. 7 where a first via is formed to contact the second spacer, in accordance with an embodiment of the present invention.

FIG. 8 is a cross-sectional view of the semiconductor structure of FIG. 7 where a first via is formed to contact the second spacer, in accordance with an embodiment of the present invention.

In various exemplary embodiments, a first via 30 is formed. The first via 30 directly contacts the second spacer 20. The first via 30 directly contacts the bottom electrode plate 12 and the top electrode plate 24. Thus, the first via 30 contacts alternating plates.

The first via can be constructed by etching through the MIM capacitor stack structure 60. The etching can include a dry etching process such as, for example, reactive ion etching (RIE), plasma etching, ion etching or laser ablation. The etching can further include a wet chemical etching process in which one or more chemical etchants are employed to remove portions of the blanket layers that are not protected by the patterned photoresist. The patterned photoresist can be removed utilizing an ashing process.

Figure 9:
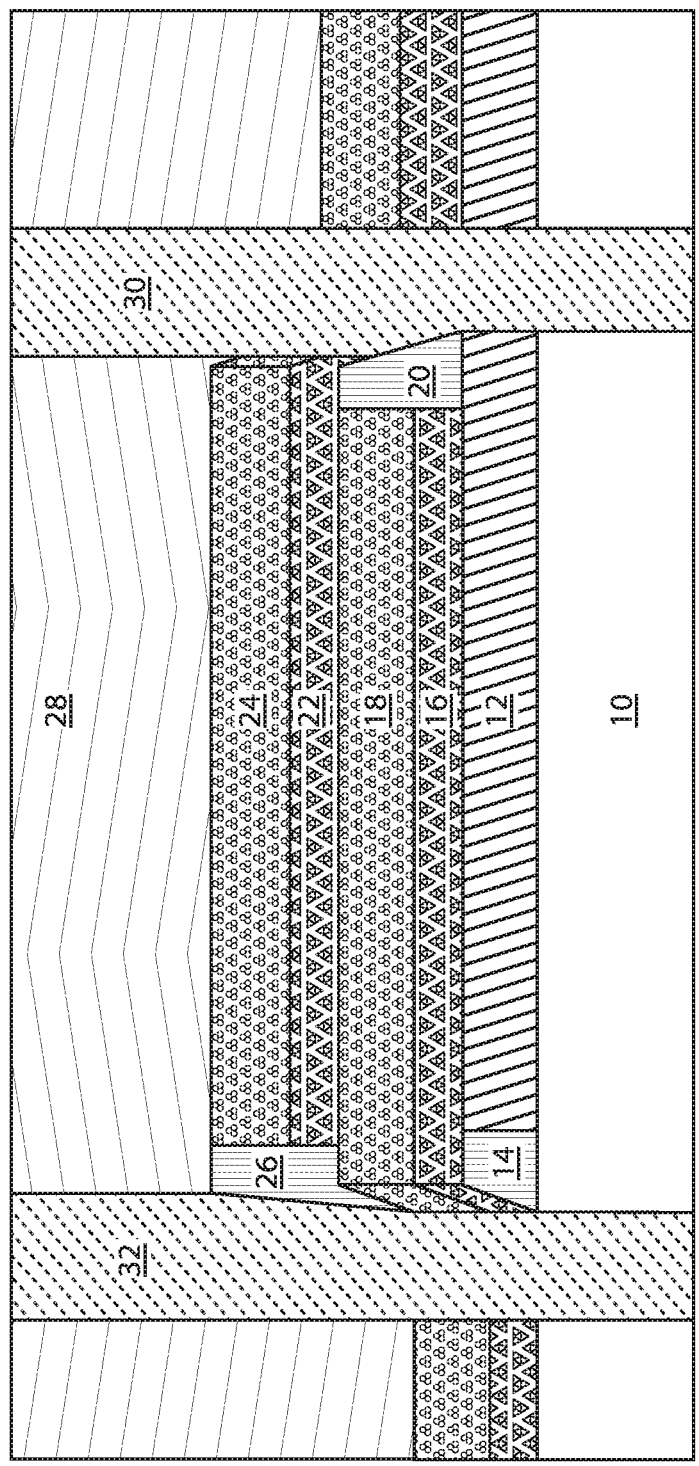
FIG. 9 is a cross-sectional view of the semiconductor structure of FIG. 8 where a second via is formed to contact the first and third spacers, in accordance with an embodiment of the present invention.

FIG. 9 is a cross-sectional view of the semiconductor structure of FIG. 8 where a second via is formed to contact the first and third spacers, in accordance with an embodiment of the present invention.

In various exemplary embodiments, a second via 32 is formed. The second via 32 directly contacts the first spacer 14 and the third spacer 26. The second via 32 directly contacts the middle electrode plate 18.

The terms contact and via, both refer to structures for electrical connection of conductors from different interconnect levels. These terms are sometimes used in the art to describe both an opening in an insulator in which the structure will be completed, and the completed structure itself. For purposes of this invention, contact and via refer to the completed structure. The term "via" can be a conductive region that connects a metallization layer with another metallization layer above or below it.

Figure 10:
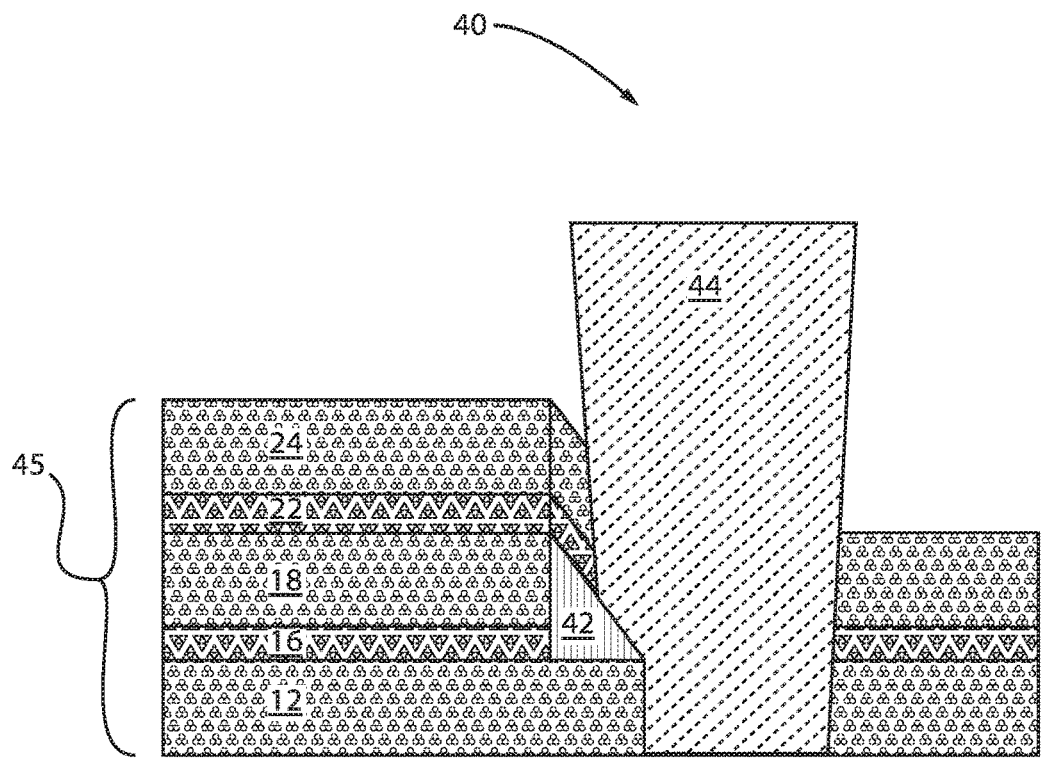
FIG. 10 is a cross-sectional view of the semiconductor structure illustrating a via contact to the top and bottom electrode plates and where a short to the middle electrode plate is prevented by a self-aligned contact (SAC) spacer, in accordance with an embodiment of the present invention.

FIG. 10 is a cross-sectional view of the semiconductor structure illustrating a via contact to the top and bottom electrode plates and where a short to the middle electrode plate is prevented by a self-aligned contact (SAC) spacer, in accordance with an embodiment of the present invention.

In various exemplary embodiments, a structure 40 can be constructed including a via 44 directly contacting a bottom electrode plate 12 and a top electrode plate 24. Contact between the via 44 and the middle plate 18 can be prevented by a spacer 42. The spacer 42 can be referred to as a self-aligned contact (SAC) spacer. The bottom, middle, and top plates 12, 18, 24 can be separated from each other by first and second high-k dielectrics layers 16, 22. A short to the middle plate 18 is prevented by the SAC spacer 42. The stack 12, 16, 18, 22, 24 can form a MIM capacitor stack 45. The MIM capacitor stack 45 thus includes 3 metallization layers and 2 insulating layers. Of course, one skilled in the art can contemplate a different number of alternating metallization and insulating layers to form a MIM structure.

Figure 11:
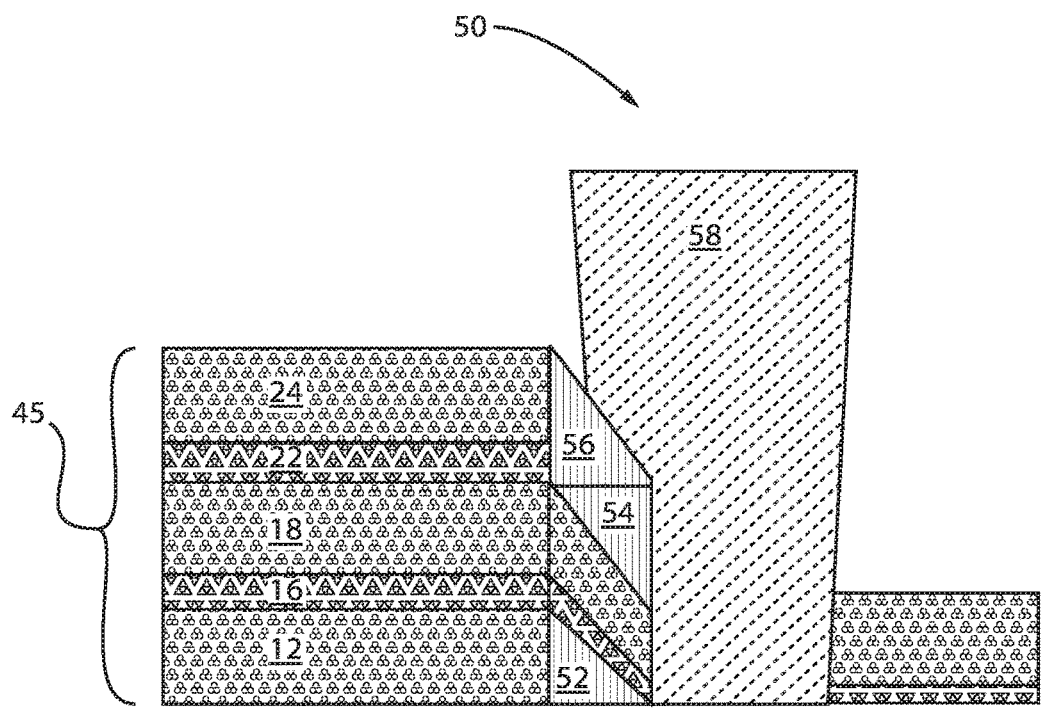
FIG. 11 is a cross-sectional view of the semiconductor structure illustrating a via contact to the middle electrode plate and where a short to the top and bottom electrode plates is prevented by multiple SAC spacers, in accordance with an embodiment of the present invention.

FIG. 11 is a cross-sectional view of the semiconductor structure illustrating a via contact to the middle electrode plate and a where short to the top and bottom electrode plates is prevented by multiple SAC spacers, in accordance with an embodiment of the present invention.

In various exemplary embodiments, a structure 50 can be constructed including a via 58 directly contacting a middle plate 18. Contact between the via 58 and the top and bottom plate 24, 12 can be prevented by spacers 52, 54, 56. The spacers 52, 54, 56 can be referred to as self-aligned contact (SAC) spacers. The bottom, middle, and top plates 12, 18, 24 can be separated from each other by first and second high-k dielectrics layers 16, 22. A short to the bottom and top plates 12, 24 is prevented by the SAC spacers 52, 54, 56. It is contemplated that the spacers 54, 56 are one single SAC spacer.

Consequently, as shown in FIGS. 10 and 11, a MIM stack 45 realized between wiring interconnect layers needs to prevent or disallow some plate connections to vias that connect wiring layers above and below. To disallow a MIM plate connection, the via must not make electrical contact with the desired plate(s). To ensure that no electrical connection exists, spacers can be formed between the disconnected metallization layer and the via. The inclusion of spacers in select locations between vias and metallization layers allows for the minimization or elimination of the enclosure rule, which defines a region in which the MIM plates do not form a capacitor. Therefore, MIM capacitors can be formed in back end of line (BEOL) with multiple electrode plates or metallization layers. The via contacts to alternating plates can be made by etching the via holes through the MIM capacitor stack. The edges of each electrode plate are protected by spacers for self-aligned contact. The spacer materials can be, e.g., SiN, doped SiN, etc, as described above. The spacers enable the elimination or significant reduction of via enclosures and a significant boost in total capacitance in a given footprint area.

As a result, the MIM capacitor structures 45, 60 of the exemplary embodiments of the present invention can be formed in BEOL interconnects. Concerning BEOL, a layer of dielectric material is blanket deposited atop the entire substrate and planarized. The blanket dielectric can be selected from the group consisting of silicon-containing materials such as $SiO_2$, $Si_3N_4$, SiOxNy, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

The blanket dielectric can be formed by various methods well known to those skilled in the art. The deposited dielectric is then patterned and etched to forth via holes to the various regions of the substrate. Following via formation, interconnects can be formed by depositing a conductive metal into the via holes using conventional processing, such as CVD or plating. The conductive metal can include, but is not limited to: tungsten, copper, aluminum, silver, gold, and alloys thereof. The BEOL layer can include one or multiple stacks of wires/vias.

Moreover, the exemplary embodiments of the present invention can be used, for example, for DRAM and eDRAM applications. DRAM (dynamic random access memory) is a type of random access memory that stores each bit of data in a separate capacitor within an integrated circuit. Since real capacitors leak charge, the information eventually fades unless the capacitor charge is refreshed periodically. Because of this refresh requirement, it is a dynamic memory as opposed to SRAM and other static memory. Its advantage over SRAM is its structural simplicity: only one transistor and a capacitor are required per bit, compared to six transistors in SRAM. This allows DRAM to reach very high density. Like SRAM, it is in the class of volatile memory devices, since it loses its data when the power supply is removed. eDRAM (embedded dynamic random access memory) is a capacitor-based dynamic random access memory usually integrated on the same die or in the same package as the main ASIC (application-specific integrated circuit) or processor, as opposed to external DRAM modules and transistor-based SRAM (static random access memory) conventionally employed for caches.

Regarding FIGS. 1-11, deposition is any process that grows, coats, or otherwise transfers a material onto the wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method for forming a stacked MIM capacitor with self-aligned contact to reduce via enclosure (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a stacked metal-insular-metal (MIM) capacitor with self-aligned contact, the method comprising:
    forming a first electrode plate over a first interlayer dielectric (ILD);
    forming a first spacer adjacent the first electrode plate;
    forming a first insulating layer over the first electrode plate;
    forming a second electrode plate over the first insulating layer;
    forming a second spacer adjacent the second electrode plate and the first insulating layer;
    forming a second insulating layer over the second electrode plate;
    forming a third electrode plate over the second insulating layer;
    forming a third spacer adjacent the third electrode plate and the second insulating layer;
    forming a second ILD over the third electrode plate; and
    forming a first via through the second ILD and directly contacting the second spacer such that the second spacer prevents the first via from contacting the second electrode plate.

2. The method of claim 1, further comprising forming a second via directly contacting the third spacer such that the third spacer prevents the second via from contacting the third electrode plate.

3. The method of claim 1, wherein the first and third spacers are substantially aligned.

4. The method of claim 1, wherein the first, second, and third spacers are formed from silicon nitride (SiN).

5. The method of claim 1, wherein each of the first, second, and third spacers defines at least one tapered surface.

6. The method of claim 1, wherein the first and second insulating layers are high-k dielectric layers.

7. A method for forming a stacked metal-insular-metal (MIM) capacitor with self-aligned contact, the method comprising:
    forming a plurality of electrode plates separated from each other by dielectric layers; and
    forming at least one spacer of a plurality of spacers adjacent at least one electrode plate of the plurality of electrode plates, wherein all of the plurality of spacers are formed directly between two vias,
    wherein the at least one spacer includes a tapered surface directly contacting at least one of the two vias.

8. The method of claim 7, wherein the plurality of electrode plates includes three electrode plates alternating between the dielectric layers.

9. The method of claim 8, wherein the dielectric layers include two dielectric layers.

10. The method of claim 7, wherein the tapered surface of the at least one spacer prevents an edge of the at least one electrode plate of the plurality of electrode plates from contacting the at least one of the two vias.

11. The method of claim 7, wherein the at least one spacer is a silicon nitride (SiN) self-aligned contact spacer.

12. The method of claim 7, wherein the dielectric layers are high-k dielectric layers.

13. A semiconductor structure for constructing a stacked metal-insular-metal (MIM) capacitor with self-aligned contact, the structure comprising:
- a first electrode plate disposed over a first interlayer dielectric (ILD);
- a first spacer disposed adjacent the first electrode plate;
- a first insulating layer disposed over the first electrode plate;
- a second electrode plate disposed over the first insulating layer;
- a second spacer disposed adjacent the second electrode plate and the first insulating layer;
- a second insulating layer disposed over the second electrode plate;
- a third electrode plate disposed over the second insulating layer;
- a third spacer disposed adjacent the third electrode plate and the second insulating layer;
- a second ILD disposed over the third electrode plate; and
- a first via disposed through the second ILD to directly contact the second spacer such that the second spacer prevents the first via from contacting the second electrode plate.

14. The structure of claim 13, wherein a second via is constructed to directly contact the third spacer such that the third spacer prevents the second via from contacting the third electrode plate.

15. The structure of claim 13, wherein the first and third spacers are substantially aligned.

16. The structure of claim 13, wherein the first, second, and third spacers are constructed from silicon nitride (SiN).

17. The structure of claim 13, wherein each of the first, second, and third spacers defines at least one tapered surface.

18. The structure of claim 13, wherein the first and second insulating layers are high-k dielectric layers.

* * * * *